(12) United States Patent
Lin et al.

(10) Patent No.: US 9,264,087 B2
(45) Date of Patent: Feb. 16, 2016

(54) ELECTRONIC DEVICE

(71) Applicant: Cho-Yi Lin, New Taipei (TW)

(72) Inventors: Tsung-Peng Lin, Taipei (TW); Cho-Yi Lin, New Taipei (TW); Hong-Fan Wei, Taipei (TW)

(73) Assignee: Shenzhen China Star Optoelectronics Technology Co., Ltd., Guangming District of Shenzhen, Shenzhen, Guangdong (CN)

( * ) Notice: Subject to any disclaimer, the term of this patent is extended or adjusted under 35 U.S.C. 154(b) by 18 days.

(21) Appl. No.: 14/276,773

(22) Filed: May 13, 2014

(65) Prior Publication Data

US 2014/0247568 A1    Sep. 4, 2014

Related U.S. Application Data

(63) Continuation-in-part of application No. 14/026,584, filed on Sep. 13, 2013.

(51) Int. Cl.
*H05K 5/00*    (2006.01)
*H04B 1/3818*    (2015.01)

(52) U.S. Cl.
CPC .................................. *H04B 1/3818* (2015.01)

(58) Field of Classification Search
USPC ..................................... 361/754, 679.01, 752
See application file for complete search history.

(56) References Cited

U.S. PATENT DOCUMENTS

| | | | |
|---|---|---|---|
| 6,148,183 A | 11/2000 | Higdon | |
| 7,489,522 B2 * | 2/2009 | Hoshino et al. | 361/797 |
| 7,573,719 B2 * | 8/2009 | Allcock et al. | 361/752 |
| 8,253,046 B2 | 8/2012 | Chen | |
| 8,824,153 B2 * | 9/2014 | Chang | 361/754 |
| 2006/0274511 A1 | 12/2006 | Choi | |
| 2011/0255252 A1 * | 10/2011 | Sloey et al. | 361/752 |
| 2012/0050962 A1 | 3/2012 | Hsiung | |
| 2012/0325634 A1 | 12/2012 | Yang | |
| 2013/0026340 A1 | 1/2013 | Kanamori | |
| 2014/0218877 A1 | 8/2014 | Wei et al. | |

* cited by examiner

*Primary Examiner* — Andargie M Aychillhum
(74) *Attorney, Agent, or Firm* — Winston Hsu; Scott Margo

(57) ABSTRACT

An electronic device includes a case, a switch, a connecting tray and a moving member. The case has an opening. The switch is disposed in the case and near the opening. The connecting tray is disposed in the case and near the opening. The moving member is disposed on the opening in a movable manner. The moving member includes a pressing portion and a carrying portion. The pressing portion is movably connected to the carrying portion, the carrying portion is for carrying a function card and is plugged in the connecting tray in a detachable manner, and the pressing portion is for moving relative to the carrying portion, thereby triggering the switch.

8 Claims, 11 Drawing Sheets

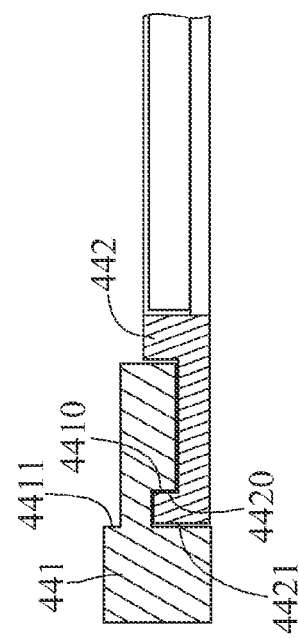
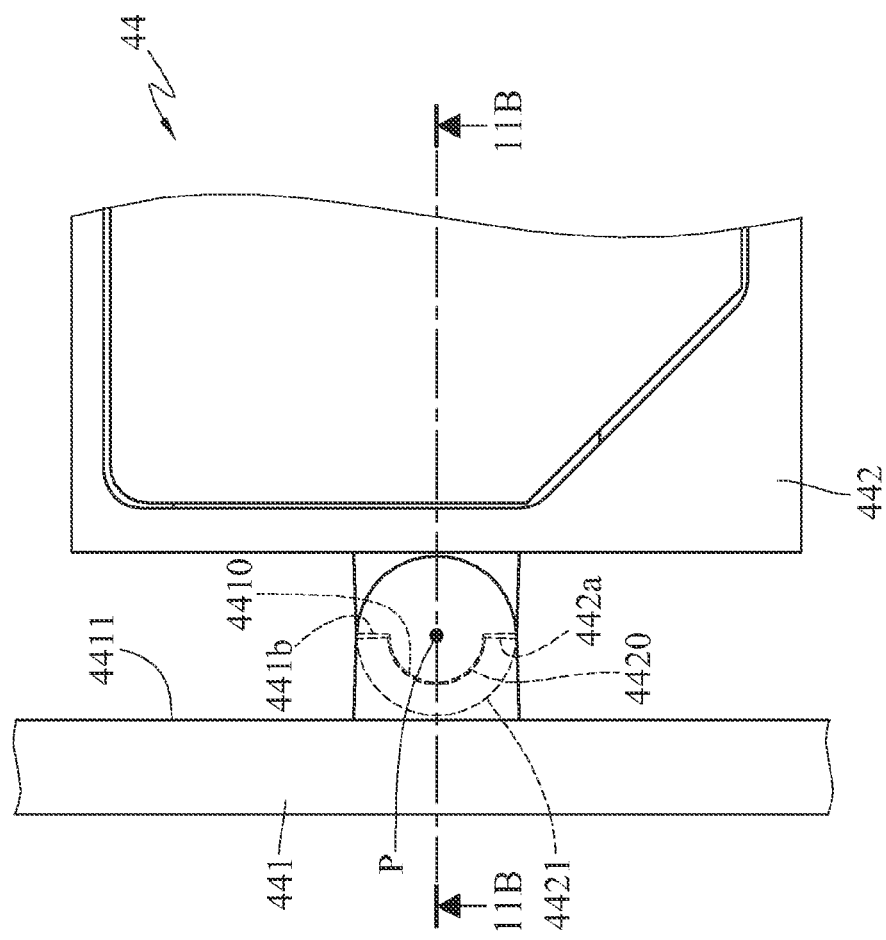
FIG. 11B
FIG. 11A

ELECTRONIC DEVICE

CROSS-REFERENCE TO RELATED APPLICATIONS

This non-provisional application is a continuation-in-part patent application of U.S. application Ser. No. 14/026,584 filed on Sep. 13, 2013, which claims priority under 35 U.S.C. §119(a) on Patent Application No(s). 102202335 filed in Taiwan, R.O.C. on Feb. 1, 2013, the entire contents of which are hereby incorporated by reference.

TECHNICAL FIELD

The disclosure relates to an electronic device, more particularly to an electronic device having a moving member which has a pressing portion for triggering a switch and a carrying portion for carrying a function card.

BACKGROUND

Nowadays electronic devices are light and compact for better portability and for reducing material costs. Moreover, consumers want the electronic devices to have a lot of functions. To satisfy the consumers, the related industries have designed expansion elements which enable the electronic devices to have more functions.

Furthermore, when operating the electronic device, users need buttons for operation. These buttons and expansion elements take up large space in the electronic device and this makes the electronic device difficult to be light and slim.

SUMMARY

An electronic device comprises a case, a switch, a connecting tray and a moving member. The case has an opening. The switch is disposed in the case and near the opening. The connecting tray is disposed in the case and near the opening. The moving member is disposed on the opening in a movable manner. The moving member comprises a pressing portion and a carrying portion. The pressing portion is movably connected to the carrying portion. The carrying portion is configured for carrying a function card and is plugged in the connecting tray in a detachable manner, and the pressing portion is configured for moving relative to the carrying portion, thereby triggering the switch.

An electronic device comprises a case, two switches, a connecting tray and a moving member. The case has an opening. The two switches are disposed in the case and near the opening. The connecting tray is disposed in the case and near the opening, while the two switches are located on opposite sides of the connecting tray. The moving member is disposed on the opening in a movable manner. The moving member comprises two pressing portions and a carrying portion. The two pressing portions are movably connected to the carrying portion. The carrying portion is configured for carrying a function card and is plugged in the connecting tray in a detachable manner, and the two pressing portions are configured for moving relative to the carrying portion, thereby triggering the two switches respectively.

BRIEF DESCRIPTION OF THE DRAWINGS

The present disclosure will become more fully understood from the detailed description and the drawings given herein below for illustration only, and thus does not limit the present disclosure, wherein:

FIG. 11A is a top view of the moving member according to still another embodiment of the disclosure;
and
FIG. 11B is a sectional view of FIG. 11A.

DETAILED DESCRIPTION

Figure 1:
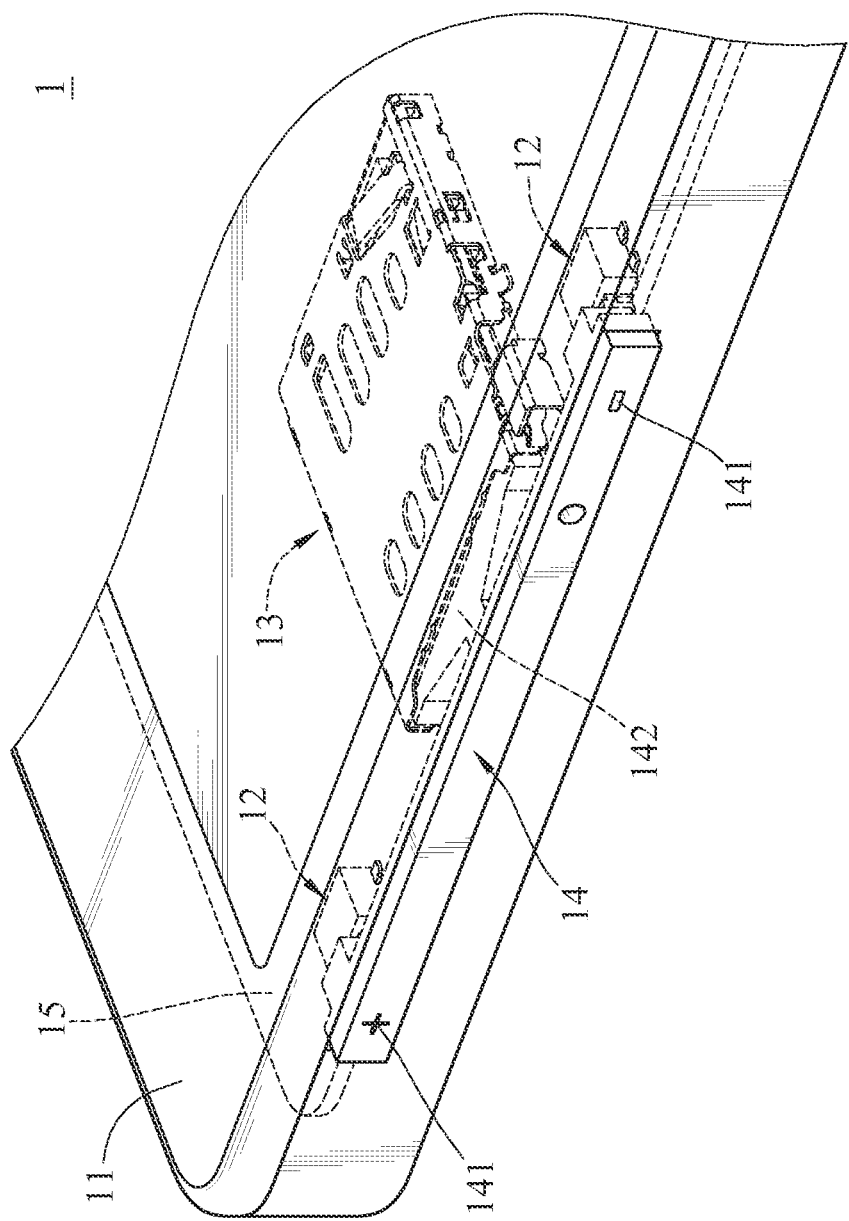
FIG. 1 is a perspective view of an electronic device according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
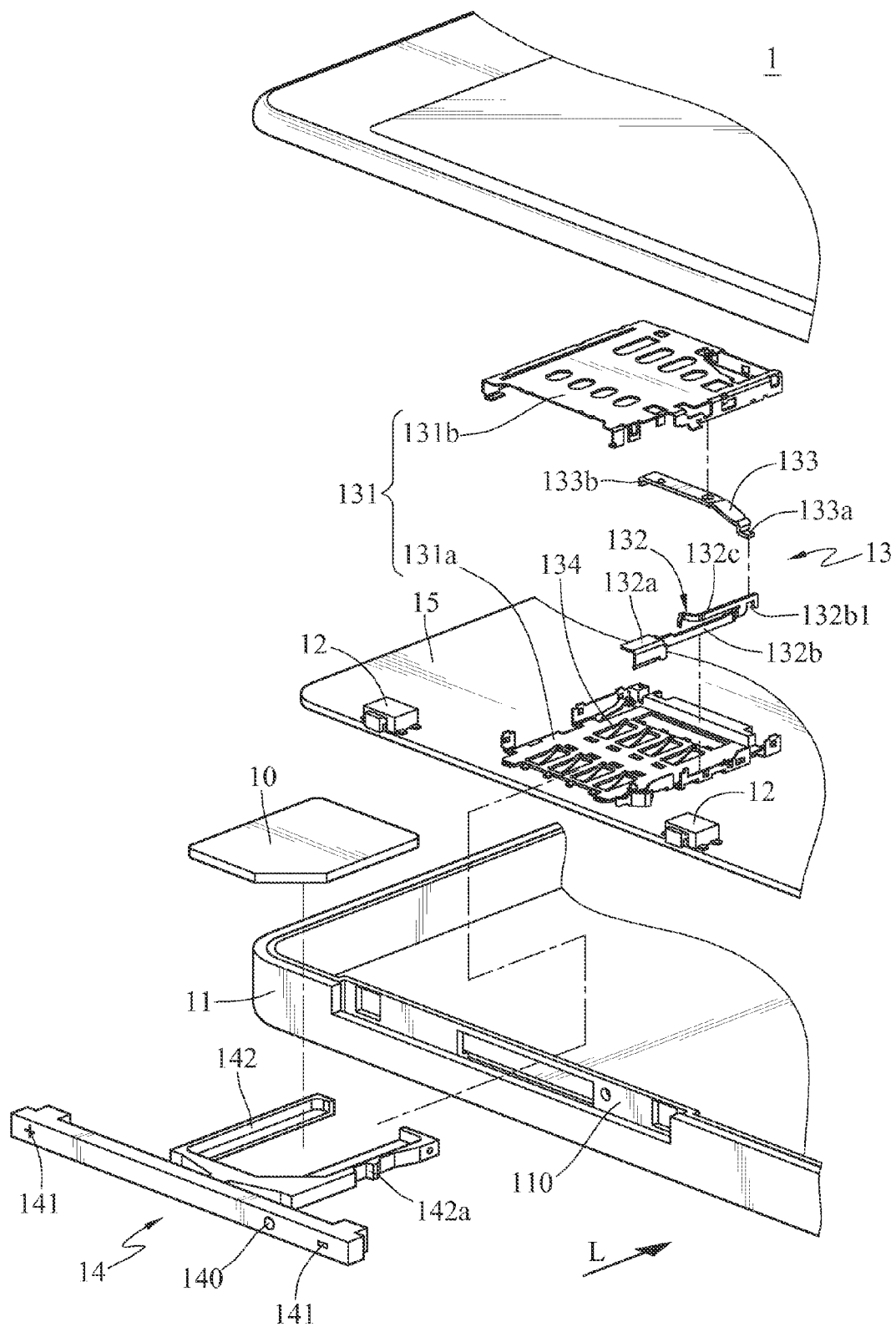
FIG. 2 is an exploded view of FIG. 1.

FIG. 1 is a perspective view of an electronic device according to one embodiment of the disclosure; FIG. 2 is an exploded view of FIG. 1. As seen in FIG. 1 and FIG. 2, in this embodiment, the electronic device 1 comprises a case 11, a plurality of switches 12, a connecting tray 13, a moving member 14 and a circuit board 15. The case 11 has an opening 110. The switches 12 and the connecting tray 13 are electrically connected to the circuit board 15. The switches 12, the connecting tray 13 and the circuit board 15 are disposed inside the case 11. The switches 12 and the connecting tray 13 are near the opening 110 and both the switches 12 are located on opposite sides of the connecting tray 13. In this embodiment, the number of the switches 12 is two, but it is not limited thereto. In other embodiments, the number of the switch may be one or more than two.

The moving member 14 is movably disposed on the opening 110 and comprises a plurality of pressing portions 141 and a carrying portion 142. The pressing portions 141 are movably fixed to the carrying portion 142. The carrying portion 142 is for disposing a function card 10 and may be plugged into the connecting tray 13 in a detachable manner. The function card 10 is, for example, a subscriber identity module card (SIM card) or a memory card. The pressing portion 141 can bend and move relative to the carrying portion 142 for triggering the switch 12.

The connecting tray 13 comprises a main body 131, a fixing member 132, a pushing member 133 and a connector 134. The main body 131 comprises a bottom part 131a and a cover 131b. The bottom part 131a and the cover 131b may form an accommodating space when they are combined together. The main body 131 is for accommodating the carrying portion 142. The fixing member 132 is disposed on the main body 131. The carrying portion 142 further comprises a fastening portion 142a. When the carrying portion 142 is plugged in the main body 131 of the connecting tray 13, the fixing member 132 is fastened with the fastening portion 142a. The pushing member 133 is pivoted on the main body 131. One end 133a of the pushing member 133 is disposed on the fixing member 132 in a rotatable manner, while the other end 133b of the pushing member 133 is for pushing the carrying portion 142 inside the main body 131. When the fastening connection between the fixing member 132 and the fastening portion 142a is released, the fixing member 132 moves and makes the pushing member 133 rotate so that the pushing member 133 pushes the carrying portion 142 out of the connecting tray 13. The connector 134 is disposed on the bottom part 131a of the main body 131 and is for being electrically connected to the function card 10.

The moving member 14 has an ejecting hole 140 with a through direction L. The through direction L faces the fixing member 132. The ejecting hole 140 is crossed via an ejecting needle (shown in FIG. 3 and FIG. 4) to releasing the fastening connection of the fixing member 132 and the fastening portion 142a.

The fixing member 132 comprises a pushed portion 132a, a link portion 132b and an elastic hook 132c. The pushed portion 132a is disposed on one end of the link portion 132b and near the ejecting hole 140. The through direction L faces the pushed portion 132a. The pushing member 133 is disposed on the other end of the link portion 132b in a rotatable manner. The elastic hook 132c is disposed on the link portion 132b and faces the carrying portion 142. The link portion 132b has a concave 132b1 which is on the one end 133a of the pushing member 133 for enabling the pushing member 133 to rotate slightly.

Figure 3:
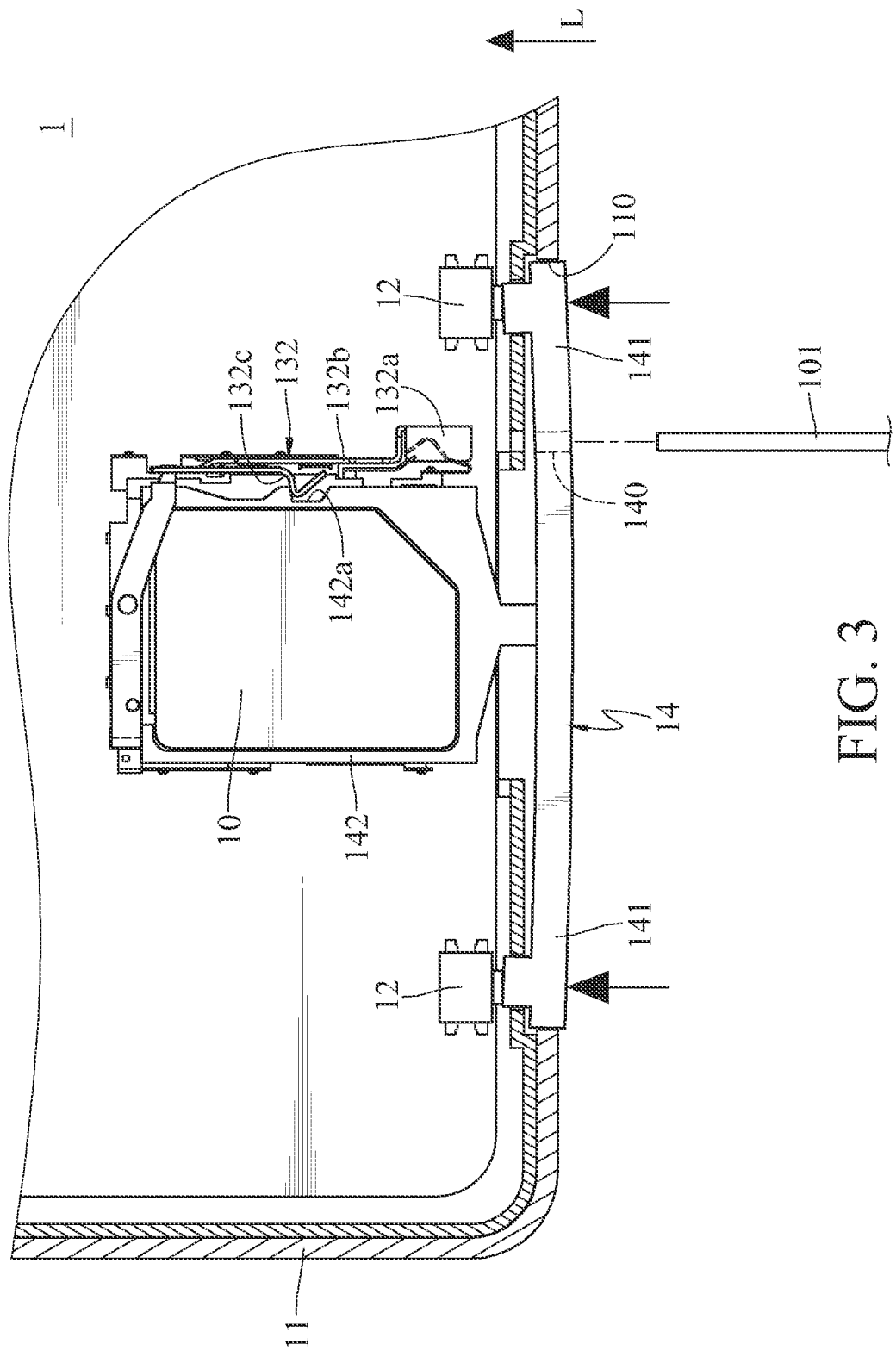
FIG. 3 is a top view of FIG. 1.

FIG. 3 is a top view of FIG. 1. As seen in FIG. 3, when the moving member 14 is disposed on the opening 110, the fastening portion 142a of the carrying portion 142 is fastened with the elastic hook 132c of the fixing member 132. Thereby, the moving member 14 is fixed to the opening 110. When the user wants to trigger the switch 12, the user may press the pressing portion 141. Then, the pressing portion 141 deforms, thereby making a part of the pressing portion 141 moves towards the switch 12 for triggering it.

Figure 4:
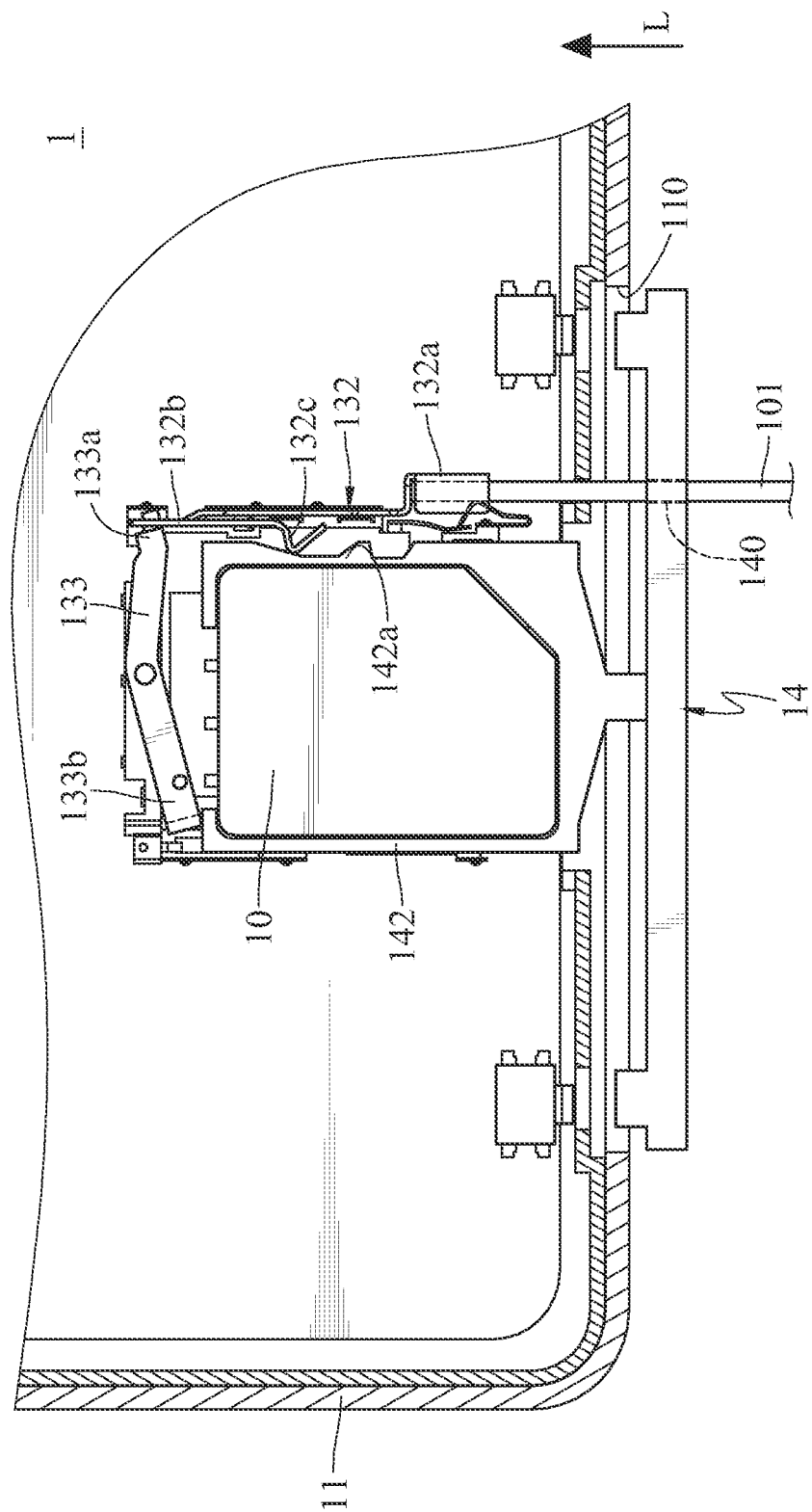
FIG. 4 is a top view of the moving member leaving the case of FIG. 1.
Figure 5:
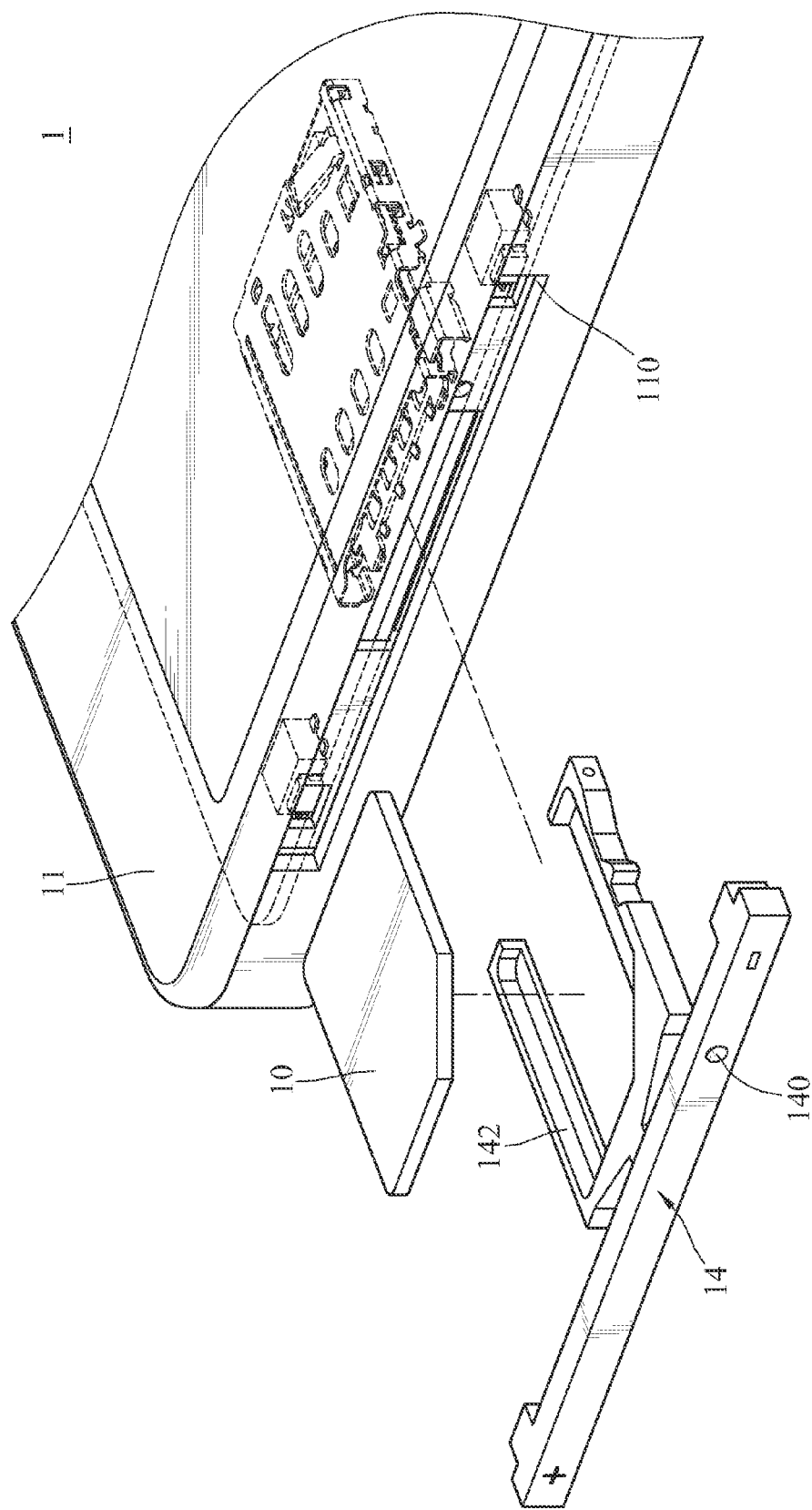
FIG. 5 is an exploded view of the electronic device and the function card therein of FIG. 1.

FIG. 4 is a top view of the moving member 14 leaving the case of FIG. 1; FIG. 5 is a perspective view of the electronic device and the function card therein of FIG. 1. As seen in FIG. 3, FIG. 4 and FIG. 5, when it is needed to place, remove or replace the function card 10, the user may utilize the ejecting needle 101 to make the moving member 14 leave the case 11. The ejecting needle 101 is thrust the pushed portion 132a of the fixing member 132 via the ejecting hole 140 along the through direction L, thereby making the link portion 132b and the elastic hook 132c move along the through direction L accordingly. The elastic hook 132c is driven by the link portion 132b so it cannot stay in the fastening portion 142a and is pushed out by the carrying portion 142. Therefore, the fastening connection between the elastic hook 132c and the fastening portion 142a is released. As seen in FIG. 4, since the link portion 132b keep moving along the through direction L, one end 133a of the pushing member 133 is pushed by the link portion 132b so that the pushing member 133 rotates counterclockwise. As a result, the other end 133b of the pushing member 133 moves in the direction opposite to the through direction L, thereby pushing the carrying portion 142 towards the direction opposite to the through direction L. This way, the moving member 14 is pushed out of the case 11 so the user may take it out. Thus, as seen in FIG. 5, the user may place the function card 10 in the carrying portion 142, take it out from the carrying portion 142 or replace it. After this, the moving member 14 can be pushed back to the opening 110 of the case 11 while the elastic hook 132c can be fastened with the fastening portion 142a again. Thereby, the moving member 14 is fixed to the opening 110 of the case 11.

Figure 6:
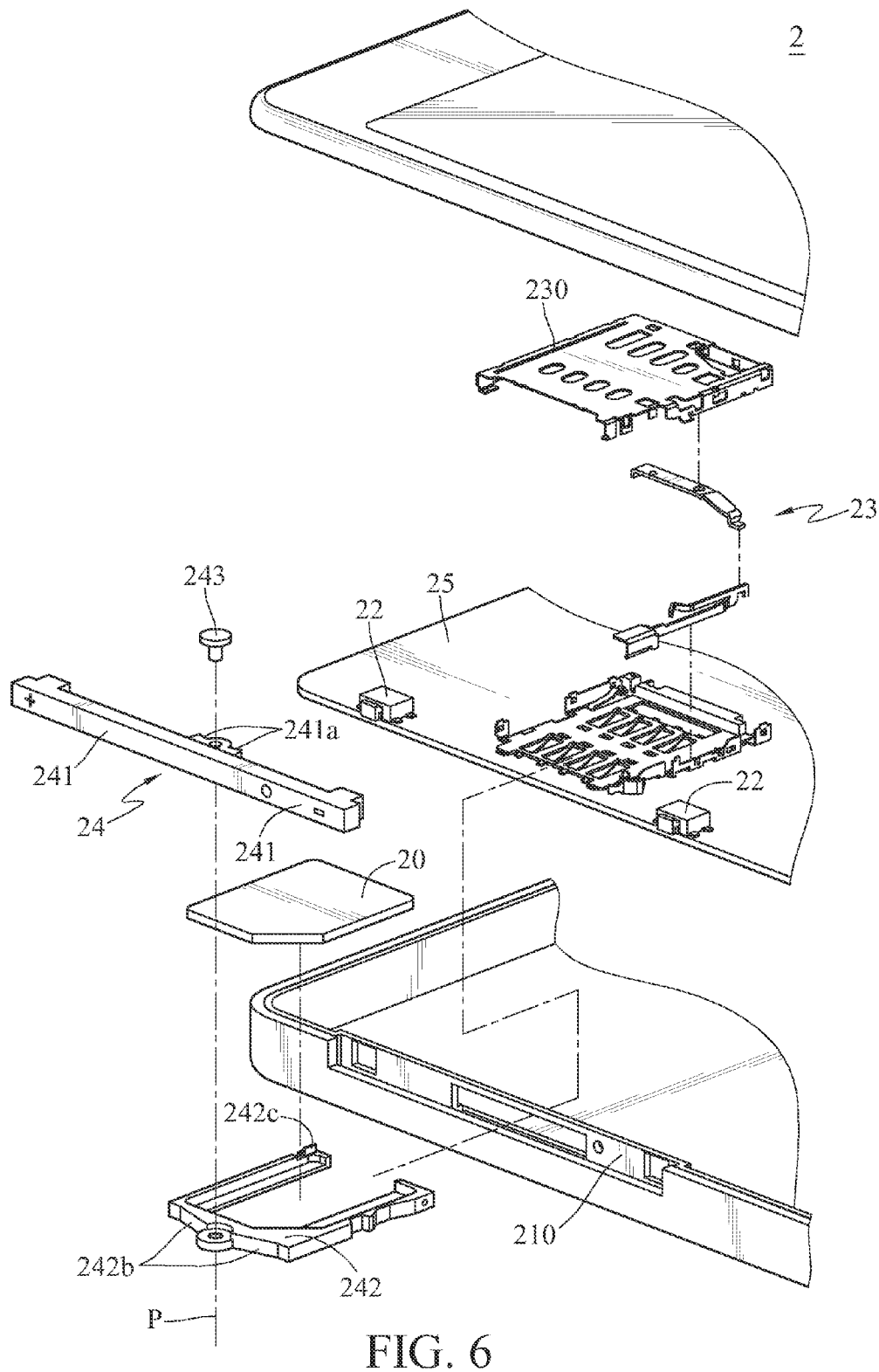
FIG. 6 is an exploded view of an electronic device according to another embodiment of the disclosure.
Figure 7:
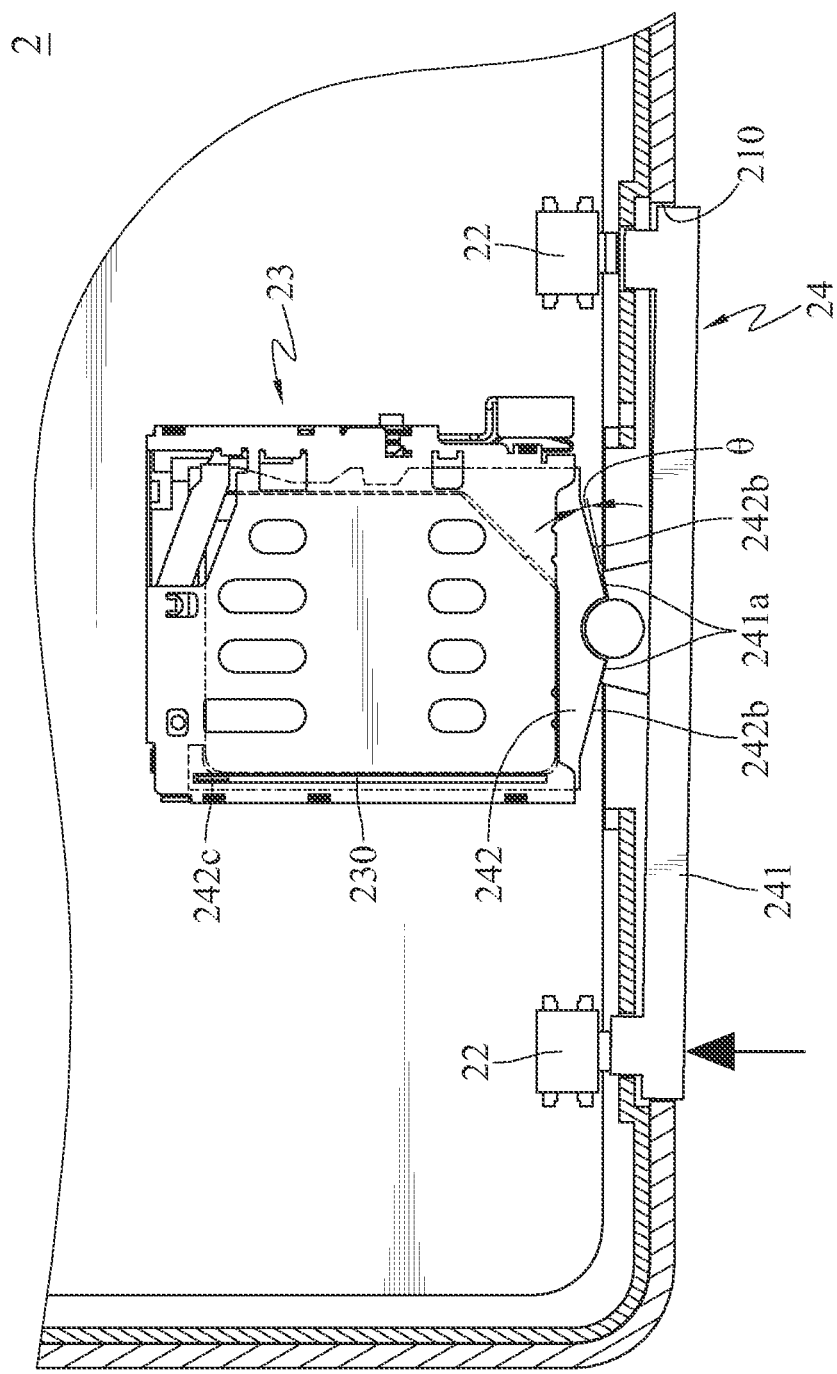
FIG. 7 is a top view of FIG. 6.

FIG. 6 is an exploded view of an electronic device according to another embodiment of the disclosure; FIG. 7 is a top view of FIG. 6. As seen in FIG. 6 and FIG. 7, the electronic device 2 of this embodiment is similar to the electronic device 1 of FIG. 2. The electronic device 2 comprises a case 21, a plurality of switches 22, a connecting tray 23, a moving member 24 and a circuit board 25. However, in this embodiment, as for the moving member 24 of the electronic device 2, the pressing portion 241 is pivoted on the carrying portion 242 via a pivoting member 243 around an axis P as a rotational axis. The axis P is located approximately at a place between the switches 22. The pressing portion 241 has a first limit slope 241a near the axis P. The carrying portion 242 has a second limit slope 242b near the axis P. An angle θ is formed between the first limit slope 241 and the second limit slope 242b, which is for limiting the pressing portion 241 and the carrying portion 242 rotate within the angle θ.

The carrying portion 242 has a first stop portion 242c. The connecting tray 23 has a second stop portion 230. The first stop portion 242c is a stop block, and the second stop portion 230 is a sliding groove. When the pressing portion 241 leaves the opening 210, the first stop portion 242c is interfered with the second stop portion 230 so that a part of the carrying portion 242 is still inside the connecting tray 23.

Figure 8:
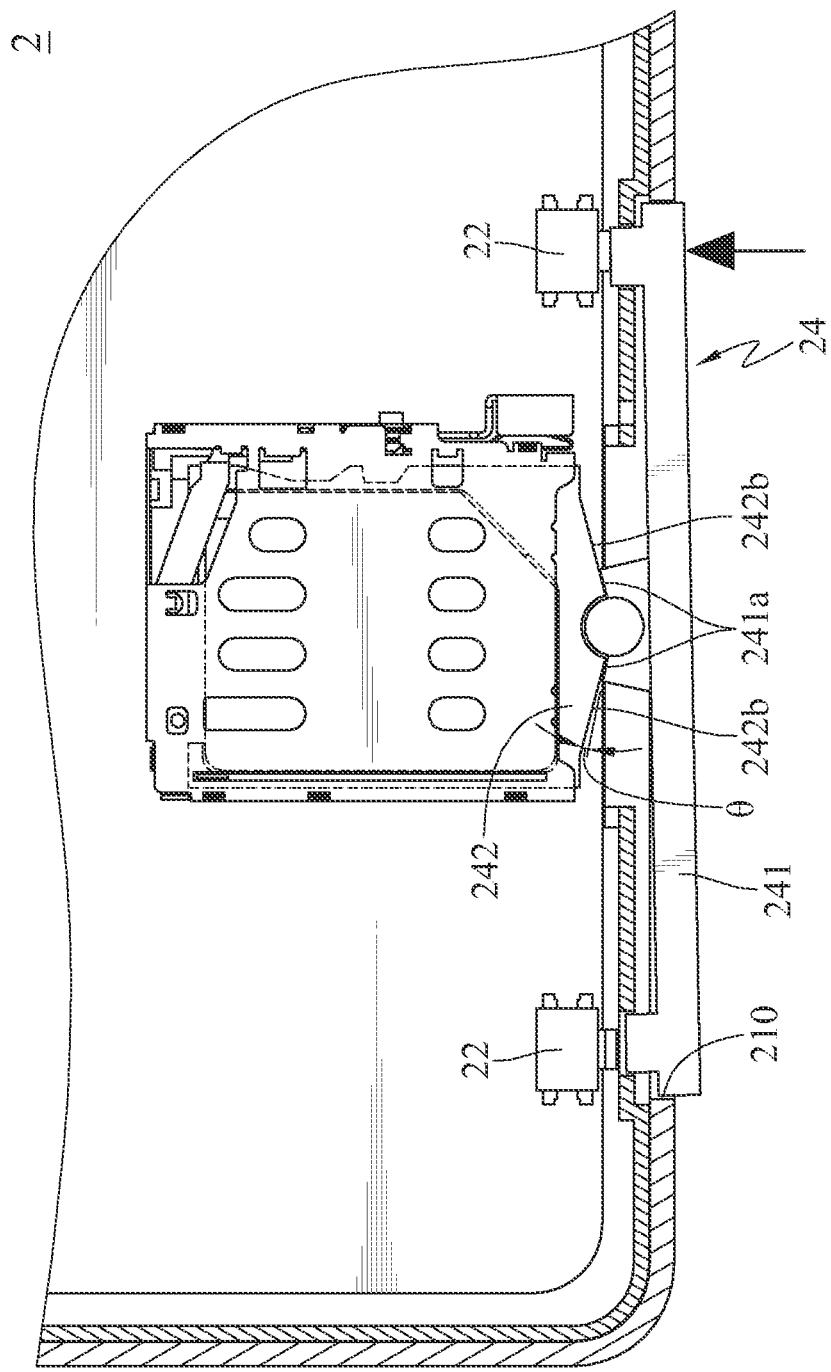
FIG. 8 is a top view of FIG. 6.

FIG. 8 is a top view of FIG. 6. As shown in FIG. 7 and FIG. 8, the moving member 24 is disposed on the opening 210 and the user wants to trigger the switch 22. When the user may press the pressing portion 241, the pressing portion 241 rotates relative to the carrying portion 242, thereby making a part of the pressing portion 241 move to the switch 22 to trigger it. As seen in FIG. 7, when pressing the pressing portion 241 on the left, it moves to the switch 22 on the left. Additionally, the first limit slope 241a and the second limit slope 242b on the left are close to each other, while an angle θ is formed between the first limit slope 241a and the second limit slope 242b on the right. Thereby, since the first limit slope 241a on the left leans on the second limit slope 242b, it limits the rotational path of the pressing portion 241. Consequently, the pressing portion 241 on the left does not push the switch 22 on the left to an undue extent, thereby avoiding damages.

Similarly, as seen in FIG. 8, when pressing the pressing portion 241 on the right, it moves to the switch 22 on the right. Additionally, the first limit slope 241a and the second limit slope 242b on the right are close to each other. The pressing portion 241 on the right does not push the switch 22 on the right to an undue extent, thereby avoiding damages.

Figure 9:
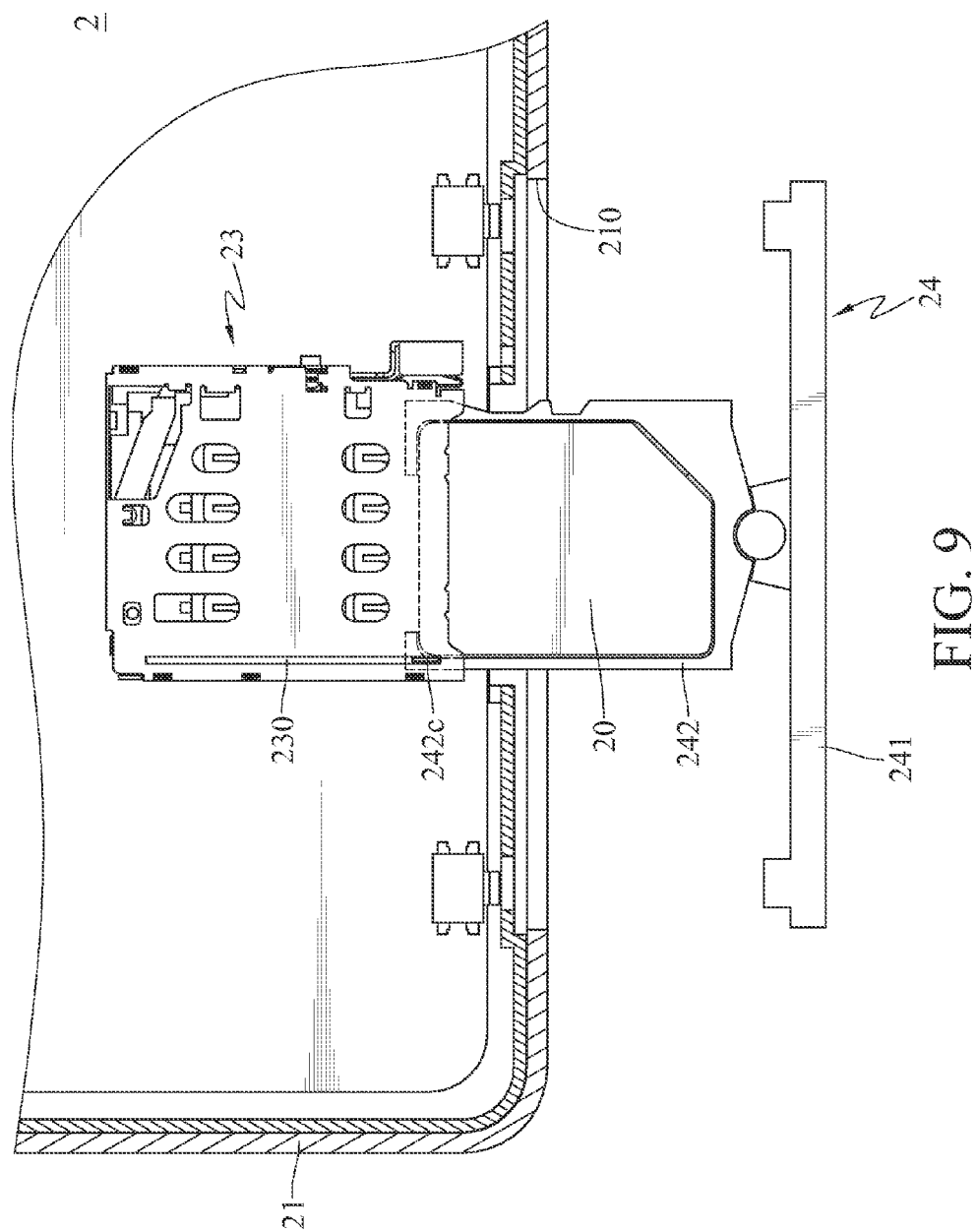
FIG. 9 is a top view of the electronic device and the function card therein of FIG. 6.

FIG. 9 is a top view of the electronic device and the function card therein of FIG. 6. As for the electronic device 2, the method for placing, removing and replacing the function card is similar to the electronic device 1 shown in FIG. 3 and FIG. 4 so it will not be illustrated again. As seen in FIG. 9, when the user takes out the moving member 24, the first stop portion 242c slides along the second stop portion 230. The first stop portion 242c and the second stop portion 230 are interfered with each other until the first stop portion 242c slides to the end of the second stop portion 230, so the moving member 24 does not fall out of the case 21. This avoids losing the moving member 24. Subsequently, the pressing portion 241 leaves the opening 210 and a part of the carrying portion 242 is still inside the connecting tray 23. The user now can place the function card 20 in the carrying portion 242, take it out from the carrying portion 242 or replace it therein. After this, the moving member 24 can be pushed back to the opening 210 of the case 21 for fixing the moving member 24 to the case 21.

Figures 10A, 10B:
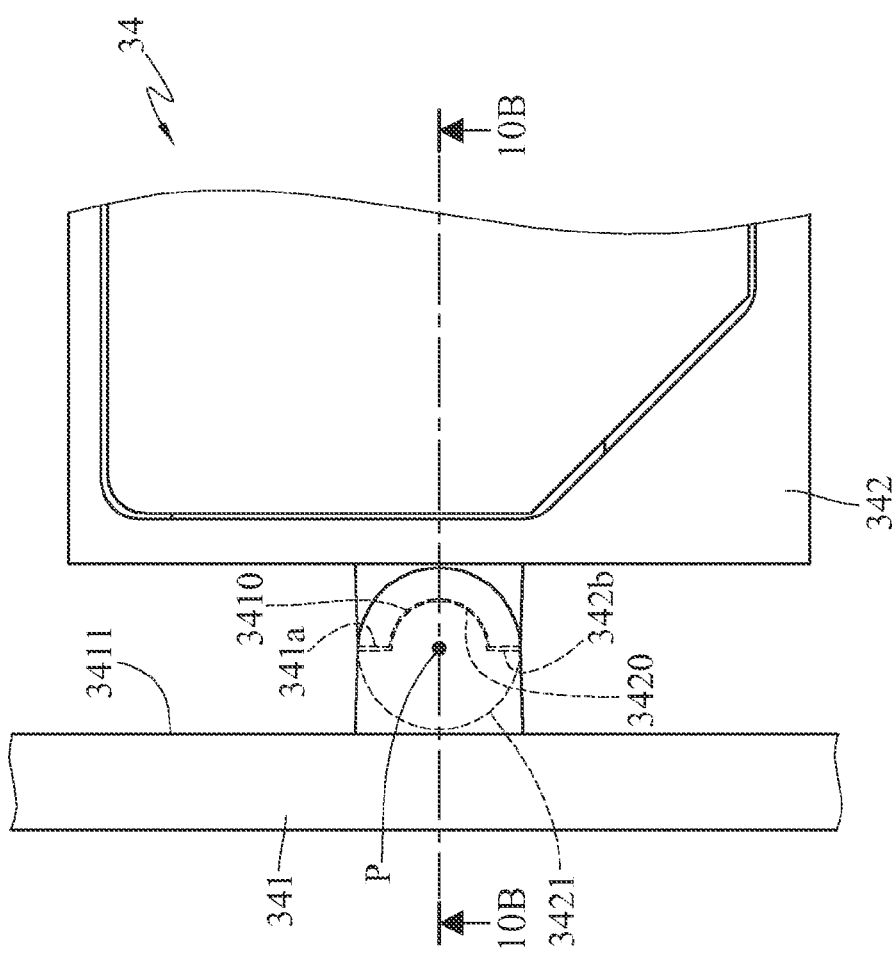
FIG. 10A is a top view of the moving member according to another embodiment of the disclosure.
FIG. 10B is a sectional view of FIG. 10A.

FIG. 10A is a top view of the moving member 34 according to another embodiment of the disclosure; FIG. 10B is a sectional view of FIG. 10A. As seen in 10A and 10B, the moving member 34 of this embodiment is similar to the moving member 24, which means the pressing portion 341 is pivoted on the carrying portion 342 around an axis P as a rotational axis. Nonetheless, the pressing portion 341 has a concave arc 3410 depressing towards a direction away from the edge 3411 of the pressing portion 341, and the first limit slope 341a is nearby the concave arc 3410. The carrying portion 342 has a convex arc 3420, which is nearby the second limit slope 342b protruding towards a direction away from the edge 3421 of the carrying portion 342. The convex arc 3420 is disposed in the concave arc 3410 and the centers of the convex arc and the concave arc overlap on the axis P. As shown in FIG. 10B, the pressing portion 341 is on the carrying portion 342 for making the convex arc 3420, which is disposed inside the concave arc 3410. When the moving member 34 leaves the case 11 of FIG. 1 or the case 21 of FIG. 6, the pressing portion 341 can be separated from the carrying portion 342. When the moving member 34 is disposed in the case 11 of FIG. 1 or the case 21 of FIG. 6, the convex arc 3420 and the concave arc 3410 can be combined together and then be placed in the case 11 or case 21. The height of the combination of the convex arc 3420 of the pressing portion 341 and the concave arc 3410 of the carrying portion 342 fits the opening 110 of the case 11 and the opening 210 of the case 21. Thereby, when the moving member 34 is disposed on the opening 110 or the opening 210, the carrying portion 342 and the pressing portion 341 do not drop out.

FIG. 11A is a top view of the moving member according to still another embodiment of the disclosure; FIG. 11B is a sectional view of FIG. 11A. As seen in FIG. 11A and FIG. 11B, the moving member 44 of this embodiment is similar to the moving member 34 of FIG. 10A and FIG. 10B. However, compared to the convex arc 3420 and the concave arc 3410 of the moving member 34, the convex arc 4420 and the concave arc 4410 of the moving member 44 are placed conversely. The pressing portion 441 has a convex arc 4410 protruding towards a direction away from the edge 4411 of the pressing portion 441, and, the first limit slope 441b is nearby 4410. The carrying portion 442 has a concave arc 4420 depressing towards a direction away from the edge 4421 of the carrying portion 442, and the second limit slope 4420 is nearby 442a.

To sum up, in the electronic device of the disclosure, the moving member is disposed on the opening or the case. Additionally, the moving member has the pressing portion for triggering the switch and the carrying portion for carrying the function card. This way, the switch and the connecting tray are integrally designed so they are close to each other and take up less space.

What is claimed is:

1. An electronic device comprising:
a case having an opening;
a switch disposed in the case and near the opening;
a connecting tray disposed in the case and near the opening; and
a moving member disposed on the opening in a movable manner, wherein the moving member comprises a pressing portion and a carrying portion, the pressing portion is movably connected to the carrying portion, the carrying portion is configured for carrying a function card and is plugged in the connecting tray in a detachable manner, and the pressing portion is configured for moving relative to the carrying portion, thereby triggering the switch;
wherein the connecting tray comprises a main body and a fixing member, the main body is configured for accommodating the carrying portion, the fixing member is disposed on the main body, the carrying portion further comprises a fastening portion, when the carrying portion is plugged in the main body of the connecting tray, the fixing member is fastened with the fastening portion;
wherein the moving member has an ejecting hole having a through direction, the through direction faces the fixing member, the ejecting hole is configured for being run through by an ejecting needle so that the ejecting needle releases the fastening connection between the fixing member and the fastening portion;
wherein the connecting tray further comprises a pushing member pivoted on the main body, one end of the pushing member is disposed on the fixing member in a rotatable manner while the other end of the pushing member is configured for pushing the carrying portion inside the main body, when the fastening connection between the fixing member and the fastening portion is released, the fixing member moves and makes the pushing member rotate so that the pushing member pushed the carrying portion out of the connecting tray;
wherein the fixing member comprises a pushed portion, a link portion and an elastic hook, the pushed portion is disposed on one end of the link portion and is near the ejecting hole, the through direction faces the pushed portion, the pressing member is disposed on the other end of the link potion in a rotatable manner, and the elastic hook is disposed on the link portion and faces the carrying portion.

2. The electronic device according to claim 1, wherein the pressing portion is fixed to the carrying portion.

3. The electronic device according to claim 1, further comprises a circuit board disposed in the case, wherein the switch and the connecting tray are electrically connected to the circuit board, the connecting tray comprises a connector for being electrically connected to the function card.

4. The electronic device according to claim 1, wherein the carrying portion has a first stop portion while the connecting tray has a second stop portion, when the pressing portion leaves the opening, the first stop portion and the second stop portion are locked and a part of the carrying portion is inside the connecting tray.

5. The electronic device according to claim 1, wherein the function card is a subscriber identity module card or a memory card.

6. An electronic device comprising:
a case having an opening;
a switch disposed in the case and near the opening;
a connecting tray disposed in the case and near the opening; and
a moving member disposed on the opening in a movable manner, wherein the moving member comprises a pressing portion and a carrying portion, the pressing portion is movably connected to the carrying portion, the carrying portion is configured for carrying a function card and is plugged in the connecting tray in a detachable manner, and the pressing portion is configured for moving relative to the carrying portion, thereby triggering the switch;
wherein the pressing portion is pivoted on the carrying portion around an axis as a rotational axis;
wherein one of the pressing portion and the carrying portion has a convex arc, while the other of them has a concave arc depressing, the convex arc is disposed in the concave arc and the centers of the convex arc and the concave arc overlap on the axis.

7. An electronic device comprising:
a case having an opening;

a switch disposed in the case and near the opening;
a connecting tray disposed in the case and near the opening; and
a moving member disposed on the opening in a movable manner, wherein the moving member comprises a pressing portion and a carrying portion, the pressing portion is movably connected to the carrying portion, the carrying portion is configured for carrying a function card and is plugged in the connecting tray in a detachable manner, and the pressing portion is configured for moving relative to the carrying portion, thereby triggering the switch;
wherein a pivoting member extends through the moving member, the pressing portion is pivoted on the carrying portion via the pivoting member around an axis as a rotational axis.

8. The electronic device according to claim 7, wherein the pressing portion has a first limiting slope adjacent to the axis, the carrying portion has a second limiting slope adjacent to the axis, an angle is formed between the first limiting slope and the second limiting slope for limiting the pressing portion and the carrying to rotate along the angle.

* * * * *